United States Patent [19]

Schmutzler

[11] Patent Number: 4,975,805

[45] Date of Patent: Dec. 4, 1990

[54] APPARATUS FOR EXTRACTING AN ELECTRONIC CIRCUIT MODULE FROM A HOUSING

[75] Inventor: Richard W. Schmutzler, Walton, N.Y.

[73] Assignee: Databook, Inc., Ithaca, N.Y.

[21] Appl. No.: 354,720

[22] Filed: May 22, 1989

[51] Int. Cl.⁵ .............................................. H05K 5/00
[52] U.S. Cl. ................................. 361/399; 360/99.02; 360/99.06; 361/392; 361/394; 439/152; 439/160
[58] Field of Search ......................... 361/380, 391–395, 361/399, 413; 360/96.6, 99.02, 99.06; 364/708; 439/152, 160

[56] References Cited

U.S. PATENT DOCUMENTS

| | | | |
|---|---|---|---|
| 3,535,594 | 10/1970 | Meyer | 361/399 |
| 3,767,974 | 10/1973 | Donovan, Jr. et al. | |
| 3,878,736 | 4/1975 | Main et al. | |
| 3,944,311 | 3/1976 | Sprenkle et al. | |
| 3,952,232 | 4/1976 | Coules | |
| 4,083,616 | 4/1978 | McNiece et al. | |
| 4,128,288 | 12/1978 | Zachry et al. | |
| 4,178,051 | 12/1979 | Kocher et al. | |
| 4,232,926 | 11/1980 | Inouye et al. | |
| 4,243,283 | 1/1981 | McSparran | |
| 4,301,494 | 11/1981 | Jordan | |
| 4,447,101 | 5/1984 | Gugliotti | |
| 4,537,454 | 8/1985 | Douty et al. | |
| 4,562,498 | 12/1985 | Shibata | 360/99.02 |
| 4,570,196 | 2/1986 | Shimaoka et al. | 360/99.06 |
| 4,688,125 | 8/1987 | Nomoto et al. | 360/99.02 |
| 4,791,608 | 12/1988 | Fushimoto | 361/395 |

FOREIGN PATENT DOCUMENTS

0721932  3/1980  U.S.S.R. ............... 361/392

Primary Examiner—Gregory D. Thompson

[57] ABSTRACT

An apparatus and method are provided for removing an electronic module from a connector within a housing. The module is both insertable and removable through an opening within the housing. The apparatus includes a lever arm which is situated mainly internal to the housing except for an end portion of the arm which extends sufficiently far outside of the housing to enable a user to grasp the arm end portion. The lever arm includes first and second engagement points for contacting the module to assist in the extraction of the module from the housing. First, when the user initially pulls on the arm end portion, this action applies a first relatively high level extraction force to the module at said first engagement point. In this manner, the module is removed from the connector via a relatively high first mechanical advantage exhibited by the arm end portion with respect to the first engagement point. Secondly, when the user continues to pull on the arm end portion, this action applies a second extraction force less than the first extraction force to the module at the second engagement point. In this manner, the module is moved sufficiently far through the opening to enable the user to grasp and remove the module from the housing. In this second case, the arm end portion exhibits a second mechanical advantage with respect to the second engagement point which is less than the first mechanical advantage.

6 Claims, 7 Drawing Sheets

APPARATUS FOR EXTRACTING AN ELECTRONIC CIRCUIT MODULE FROM A HOUSING

CROSS REFERENCE TO RELATED PATENT APPLICATIONS

Cross reference is made to the following related patent applications which are assigned to the present Assignee: Ser. No. 07/354,793 filed May 22, 1989 entitled "Latching Apparatus For A Door And Other Members", and Ser. No. 07/354,744 filed May 22, 1989 entitled "Storage Media Drive Apparatus With Readily Accessible Electrical Characteristic Selection Capability".

BACKGROUND OF THE INVENTION

This invention relates in general to apparatus for electrically and mechanically connecting a removable electronic module to a connector situated within a housing and, more particularly, to an apparatus and method for extracting the module from the connector and housing.

BRIEF SUMMARY OF THE INvENTION

In the past, several different techniques have been employed to electrically and mechanically connect and disconnect various electronic modules to and from nearby electronic circuitry. For example, as electronics has become more modularized, it has become commonplace for several printed circuit cards to be plugged into a common back plane board situated within a housing. Back plane boards typically have a plurality of connector receptacles mounted thereon for slidably receiving respective printed circuit cards.

A printed circuit card typically includes one or more layers of electrically conductive paths which couple together the various electronic components on the card. A plurality of pin connectors often extend outwardly from one edge of the card to provide connection points to the card. These pin connectors on the card edge are inserted into and mate with a corresponding connector receptacle on the back plane board.

Unfortunately, if the number of pin connectors on a particular card is relatively high, when card removal is desired the user may have to exert a relatively large extraction force to overcome the retentive frictional force exerted by the connector receptacle of the back plane on the pin connectors of a card. Many cards and modules are relatively delicate and are subject to breakage should the user grasp the wrong part of the card in an attempt to overcome that retentive friction and remove the card from the connector into which it is inserted. It will thus be appreciated that removal of a printed circuit card or module from a back plane board or similar structure is not a straightforward matter.

To assist the user in removing printed circuit cards from back planes, a number of different tools which detachably engage the card have been employed. Unfortunately, like most tools, these tools are subject to loss or otherwise may not be readily accessible when needed for card removal.

One invention which seeks to address these problems is U.S. Pat. No. 3,535,594 issued to Meyer and entitled Printed Circuit Board Extractor. The Meyer patent discloses a printed circuit card including a pivotable ring attached to the card. The ring rotates from a storage position overlying the card to an extraction position extending outwardly from the board. The user grasps the ring and pulls the card away from the back plane and out of the housing by pulling on the ring in a direction opposite the direction in which the card was inserted in the back plane and housing.

Unfortunately, such a removal technique relies on the brute strength of the user to provide the force necessary to extract the card from the back plane. That is, the user is provided with no mechanical advantage to aid him or her in extracting the card from the back plane.

One object of the present invention is to provide an apparatus and method for extracting an electronic module from a connector situated within a housing without resorting to a separate tool.

Another object of the present invention is to provide an apparatus and method for extracting an electronic module from a connector situated within a housing without mounting a ring or a lever mechanism on the card to be removed.

In accordance with the present invention, an apparatus is provided including a housing with an opening for removably receiving an electronic module. The module exhibits a substantially parallelepiped shape and includes upper and lower opposed surfaces. An engagement point is situated on the lower surface of the module. The housing includes a chamber which communicates with the opening and which receives the module therein. The module is insertable in the chamber through the opening in a first direction and is removable from the chamber in a second direction opposite the first direction. The apparatus further includes a holding structure, situated within the housing, for removably holding the module in a fixed position within the chamber such that a predetermined amount of force is required to remove the module in the second direction. The apparatus still further includes an extractor member, situated within the chamber and extending sufficiently far outside the housing to permit grasping by a user. When the user applies force to the extractor member, the extractor member contacts the engagement point of the module and sequentially provides first and second mechanical advantages for applying removal force to the module in the second direction.

The features of the invention believed to be novel are specifically set forth in the appended claims. However, the invention itself, both as to its structure and method of operation, may best be understood by referring to the following description and accompanying drawings.

DETAILED DESCRIPTION OF THE INVENTION

Figure 1:
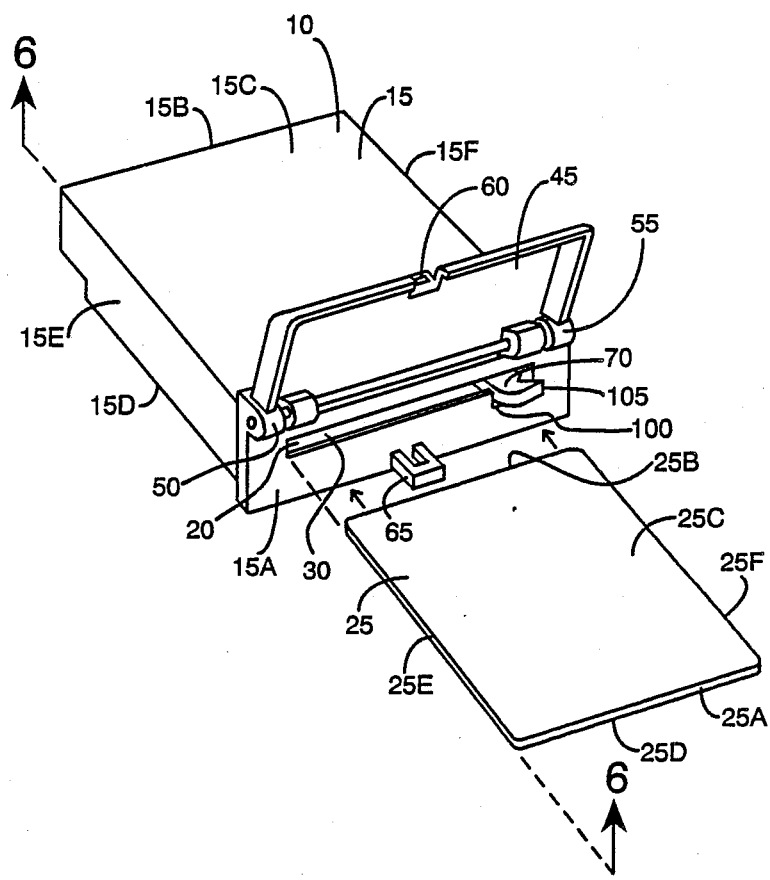
FIG. 1 is a perspective view of an electronic circuit module being inserted into a housing.

In accordance with one embodiment of the present invention, FIG. 1 shows a module receiving apparatus 10 including a housing 15 having an opening 20 therein which is shaped for receiving an electronic module 25. Opening 20 communicates with a chamber 30 which is situated within housing 15 and which receives module 25 when module 25 is passed through opening 20. Chamber 30 exhibits a geometry which is appropriately shaped to accommodate module 25 therein.

In this particular embodiment of the invention, module 25 is shaped substantially in the profile of a credit card and includes a nonvolatile memory. For example, one memory cartridge which may be employed as module 25 is the Model No. RBC008IE00 memory cartridge manufactured by Epson Corporation. The Epson memory cartridge includes 8K bytes or more of static random access memory (SRAM) which is backed up by a lithium battery to preserve data when data is stored in the cartridge. In this document, module 25 is alternatively referred to as memory cartridge 25.

Figure 2:
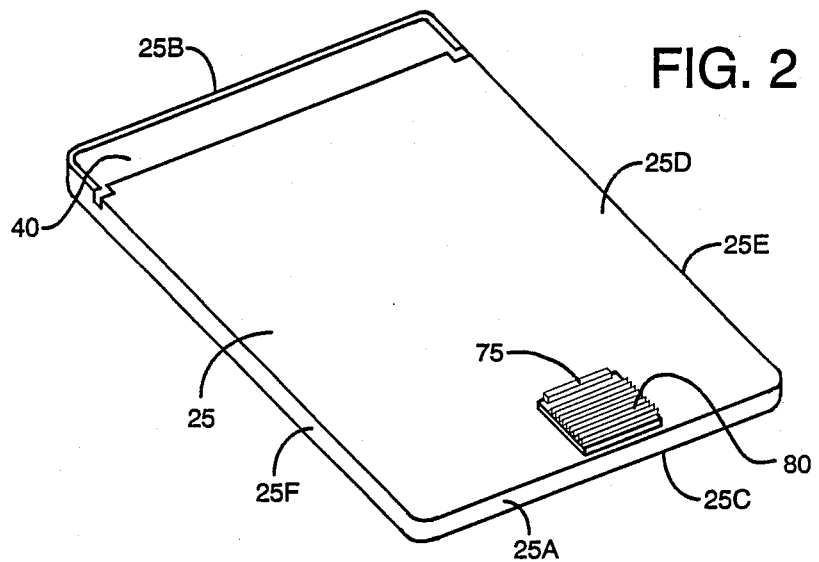
FIG. 2 is a perspective view of the electronic circuit module with the pin cover situated covering the conducting pins of the module.

FIG. 2 is a more detailed perspective view of memory cartridge 25. Cartridge 25 includes front and rear edge surfaces, 25A and 25B, respectively. Cartridge 25 further includes substantially parallel upper and lower surfaces 25C and 25D, respectively, and opposed side surfaces 25E and 25F. Cartridge 25 exhibits a thickness which is substantially less than the dimensions of upper or lower surfaces 25C and 25D. Typically, the user grasps cartridge 25 near front edge surface 25A to handle cartridge 25. The rear edge surface 25B of cartridge 25 includes a plurality of connecting pins (conductors) 35 situated under a retractable cover 40 located adjacent edge surface 25B. Connecting pins 35 are not visible in FIG. 2 since pins 35 are hidden under cover 40 which acts to keep pins 35 clean and to protect circuit components within cartridge 25 from damage due to electrostatic discharge.

Figure 3:
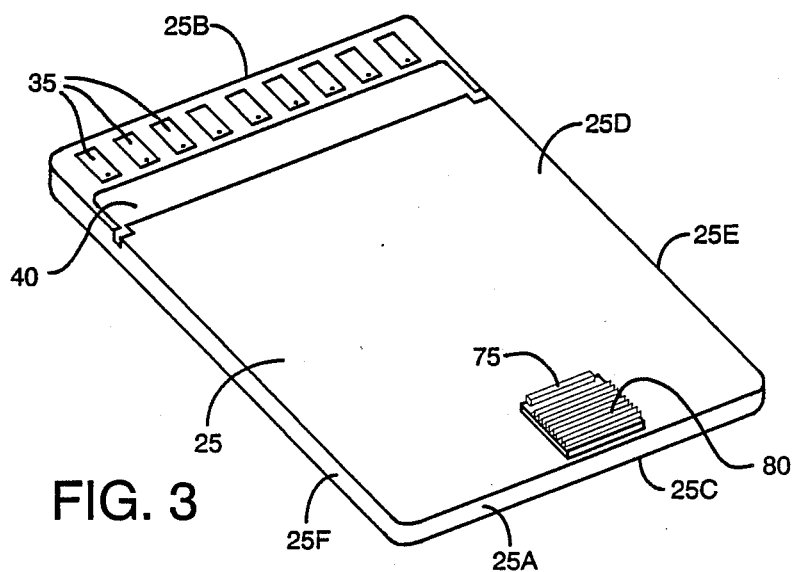
FIG. 3 is a perspective view of the electronic circuit module with the pin cover situated in the retracted position so as to expose the conducting pins of the module.

FIG. 3 is a perspective view of cartridge 25 which shows cover 40 in the retracted position. That is, cover 40 slides away from rear edge 25B to expose pins 35 when connecting pins 35 are mated with an electrical connector (not shown). Those skilled in the art will appreciate that modules and cartridges other than the one specifically shown in FIG's 1–3 as module 25 may also be employed with the invention as will be explained subsequently.

Although a pin contact type cartridge has been described above as cartridge 25, other types of cartridges may be employed with the invention as cartridge 25. For example, non-contact type memory cartridges of the "coil to coil" type such as the Model R-32KB LSI card available from Nippon LSI Card Co., LTD may also be employed as cartridge 25.

Returning again to FIG. 1, it is seen that in this particular embodiment of the invention, housing 15 exhibits a generally rectangular parallelepiped shape. Housing 15 includes front and back surfaces 15A and 15B, respectively. Housing 15 further includes top and bottom surfaces, 15C and 15D, respectively, as well as opposed side surfaces 15E and 15F. In the view of FIG. 1, back surface 15B, bottom surface 15D, and side surface 15F are partially hidden from view. Those skilled the art will appreciate that housing 15 of the invention is not limited to the particular geometry shown in FIG. 1.

A door 45 is mounted on housing 15 to cover housing front surface 15A. FIG. 1 shows door 45 in the open position ready to permit opening 20 to receive module 25. In more detail, door 45 is mounted to housing 15 via hinges 50 and 55 which are situated at the opposite ends of front surface 15A and are further situated above opening 20. Door 45 is swung downwardly to cover front surface 15A both when module receiving apparatus 10 contains a module inserted therein as well as when no module is inserted in apparatus 10.

A gasket (not shown) is mounted on door 45 such that when door 45 is closed, chamber 30 is sealed from external contaminants in the environment. When door is swung downwardly to the closed position, a latch 60 (partially shown in FIG. 1) is mated with a latch receiving member 65 to hold door 45 closed. The nature of this sealing and latching arrangement is discussed in more detail in my copending patent applications entitled "Latching Apparatus For A Door And Other Members", "Ser. No. 07/354,793 filed 5/22/89" therefore and "Storage Media Drive Apparatus With Readily Accessible Electrical Characteristic Selection Capability", "Ser. No. 07/354,744 filed 5/22/89" therefor.

Figure 4:
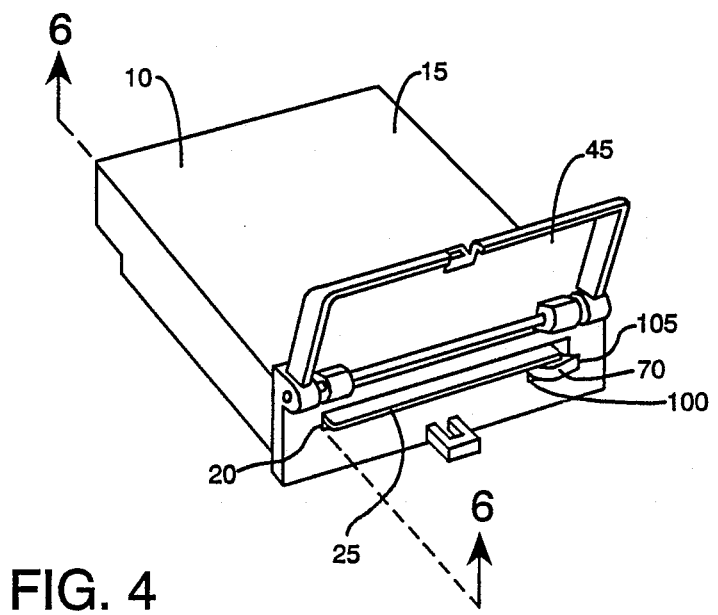
FIG. 4 is a perspective view of the electronic circuit module and housing showing the electronic circuit module fully inserted into the housing.

FIG. 4 depicts module receiving apparatus 10 after module 25 has been inserted therein and while door 45 is still open. It is observed that when module 25 is inserted into opening 20, module 25 goes so far into chamber 30 that module 25 is not readily graspable by the user to achieve removal thereof. To assist the user in removing the inserted module 25, an extractor arm 70 is mounted within housing 15 in the manner described subsequently.

Figure 5:
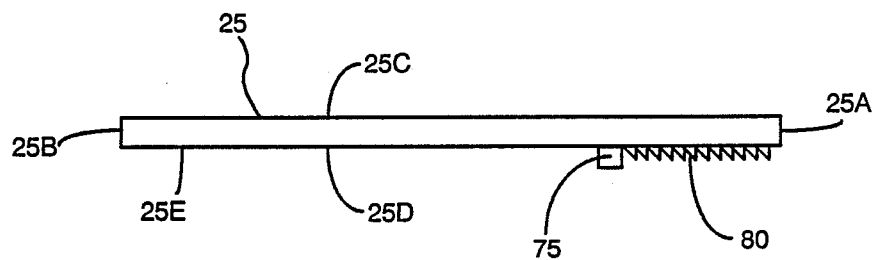
FIG. 5 is a side plan view of the electronic circuit module.

FIG. 5 is a side view of module 25 showing side surface 25E and partially showing upper and lower surfaces 25C and 25D of module 25. A ridge 75 is situated on the lower surface 25D of module 25 substantially parallel with front module surface 25A as seen more clearly in FIG. 6 which depicts module 25A in a cross-sectional view of apparatus 10 as explained subsequently. The portion of lower module surface 25D between ridge 75 and front module surface 25A is serrated thus forming a serrated portion 80 which facilitates the user's grasp of module 25 for insertion and removal.

Figure 6:
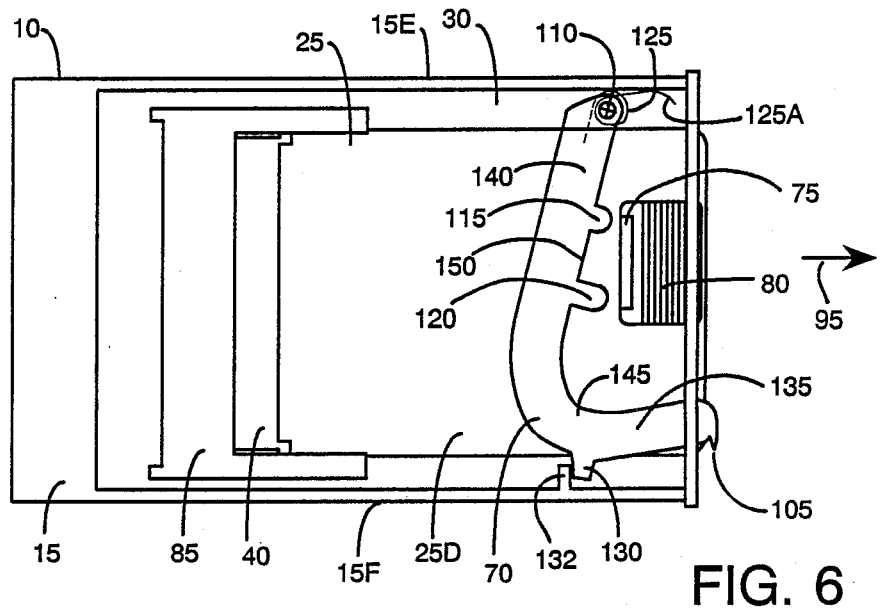
FIG. 6 is a section view of the housing showing the extractor arm retracted and the electronic control module fully inserted.
Figure 7:
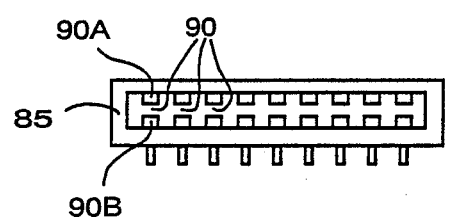
FIG. 7 is a front elevational view of the connector with which the electronic circuit module mates within the housing.

FIG. 6 is a cross-sectional view of module receiving apparatus 10 of FIG. 1 taken along section line 6—6. That is, FIG. 6 depicts apparatus 10 as viewed from the bottom of apparatus 10 along section line 6—6 of FIG. 1. Lower module surface 25D and extractor arm 70 are readily observed in FIG. 6. Module 25 is shown mated with an edge type connector 85 situated within housing 15 of module receiving apparatus 10. That is, the pins/conductors 35 depicted in module 25 of FIG. 3 are respectively mated with corresponding respective receptacles 90 shown in the end view of connector 85 illustrated in FIG. 7. Each of receptacles 90 include a pair of contacts 90A and 90B which mate with and frictionally captivate pins/conductors 35 of module 25. The contact pairs of receptacles 90 together exert a force of the pins/conductors 35 of module 25 which is sufficient to maintain electrical contact therewith under conditions of shock and vibration.

When the pins/conductors 35 of module 25 are captivated within receptacles 90 of connector 85, connector 85 exhibits a retentive frictional force when a user attempts to extract module 25 from connector 85. This retentive frictional force must be overcome before module 25 can be extracted from connector 85. More specifically, when extractor arm 70 is used to generate an extraction force substantially in the direction indicated by arrow 95 of FIG. 6, the aforementioned retentive frictional force is exerted by connector 85 in a direction opposite arrow 95, that is, inwardly toward connector 85.

Alternatively, if the earlier described non-contact type cartridge is employed as cartridge 25, then an appropriate non-contact type connector is used as connector 85 to seat non-contact type cartridge 25 and provide electrical signals to such non-contact type cartridge 25. When a non-contact cartridge 25 is situated in a non-contact connector 85, the extractor mechanism of the present invention is used to overcome the retentive frictional force exerted by such non-contact connector 85 on the non-contact type cartridge 25.

Connector 85 is coupled to electronic circuitry (not shown) for which connection to module 25 is desired. Thus, when module 25 is inserted into opening 20 of housing 15 and when module 25 is mated with connector 85, module 25 is electrically coupled to the aforementioned electronic circuitry. In this manner, the various memory circuits or other circuits within module 25 are coupled to the aforementioned electronic circuitry as desired. Various similar modules 25 can be interchangeably inserted into and operated within housing 15 in the normal use of apparatus 10. After module 25 is inserted into housing 15 of apparatus 10, hinged door 45 may be closed to provide a gasket-sealed (the gasket is not shown), substantially dust free and moisture resistant environment within housing 15 for the operation of apparatus 10 in combination with removable module 25.

Referring again to FIG. 1, one end of extractor arm 70 is seen extending from housing 15 through an extractor opening 100 adjacent to opening 20 and adjacent housing side surface 15F. In this particular embodiment, opening 100, through which the end of extractor arm 70 extends, meets with opening 20. However, other embodiments of the invention are also contemplated wherein extractor opening 100 is separated from opening 20. In the particular embodiment of the invention illustrated in FIG. 1, opening 20 and extractor opening 100 together form a single elongated L-shaped opening wherein opening 20 accommodates removable module 25 and the remaining shorter extractor opening 100 accommodates an end of extractor arm 70 protruding therethrough.

As seen in FIG. 1 and more clearly in the cross sectional view of FIG. 6, a protruding end or protrusion 105 on extractor arm 70 is visible within opening 100. Protrusion 105 of extractor arm 70 protrudes out from opening 100 sufficiently far to permit the finger of the user to grasp extractor arm 70.

FIG's 6 and 8–10 show bottom views of housing 15 along section line 6—6 which is substantially parallel with and slightly below ridge 75 of electronic module 25. FIG's 6 and 8–10 sequentially show various stages in the removal of module 25 from housing 15 and illustrate the operation of extractor arm 70 as will be described now in detail.

FIG. 6 shows a view from the bottom of housing 15 along section 6—6 which depicts electronic module 25 as being fully inserted into housing 15 and connector 85. Connector 85 is located inside housing 15 in a position sufficiently towards the back surface 15B of housing 15 so that the fully inserted module 25 is substantially enclosed within housing 15.

As seen in FIG. 6, module extractor arm 70 pivots on pivot 110 in a plane substantially parallel to lower surface 25D of electronic circuit module 25. As will be explained in more detail later, during the module extraction operation, extractor arm 70 makes contact with ridge 75 on lower surface 25D of module 30 initially with a first protrusion point 115 and next with a second protrusion point 120. Ridge 75 thus serves as an engagement point for protrusion points 115 and 120 to abut and engage module 25. In this manner a first predetermined mechanical advantage followed by a second lesser mechanical advantage is applied by extractor arm 70 against module 25 through the contact points on ridge 75 on module lower surface 25D.

A spring 125 is situated around pivot 110 to provide a retracting tension which keeps extractor arm 70 retracted substantially within housing 15. Extractor arm 70 includes a protrusion 130 which acts as an abutment point to limit the retraction travel of extractor arm 70 by making contact with a stop 132 which extends from the side of housing 15 which is adjacent side surface 15F as shown in FIG. 6.

Extractor arm 70 will now be described in detail. Referring still to FIG. 6, it is seen that extractor arm 70 is substantially V-shaped and includes arm portions 135 and 140. Arm portion 135 and 140 together form the aforementioned V-shape and exhibit a rounded vertex 145 where arm portion 135 and 140 meet. In this particular embodiment, arm portion 135 is approximately one half the length of arm portion 140.

Shorter arm portion 135 terminates in the aforementioned pointed protrusion 105 which is shaped to allow the finger of a user to easily operate extractor 70. Longer arm portion 140 terminates at pivot 110 and captively holds an end (not shown) of a coil spring 125 which is coiled around pivot 110. The remaining end 125A of coil spring 125 makes contact under tension on the inside surface of housing 15 adjacent housing side surface 15E. In this manner, spring 125 is placed under tension to provide a retracting force to extractor arm 70 which biases arm 70 inwardly toward connector 85.

Arm portion 140 of extractor arm 70 extends across the interior of housing 15 through chamber 30 in a plane substantially parallel to lower surface 25D of module 15. Therefore, protrusion 130 near vertex 145 of extractor arm 70 abuts stop 132 when module 25 is fully inserted in connector 85. Stop 132 is positioned within housing 15 such that the retracting travel of extractor arm 70 under tension of spring 125 is limited, thus leaving the tip of protrusion 105 slightly exposed outside of opening 100 on the front of housing 15.

In this particular embodiment of the invention, first protrusion 115 is located along the inner contour 150 of arm portion 140 of extractor arm 70 at a location approximately one third of the distance from pivot 110 to vertex 145 as will be described in more detail later. Second protrusion 120 is located along inner contour 150 of arm portion 140 at a location approximately nine sixteenths of the distance from pivot 110 to vertex 145.

The extractor arm operates in the following manner. The user grasps protrusion 105 of extractor arm 70 and exerts an outward or extracting force on extractor arm 70 substantially in the direction of arrow 95 in FIG. 6. The user's extracting force is resisted by the tension of spring 125, and extractor arm 70 can be moved outwardly in direction 95 relatively easily for a short distance until protrusion 115 makes contact with ridge 75 on lower surface 25D module 25 as shown in FIG. 8.

Figure 8:
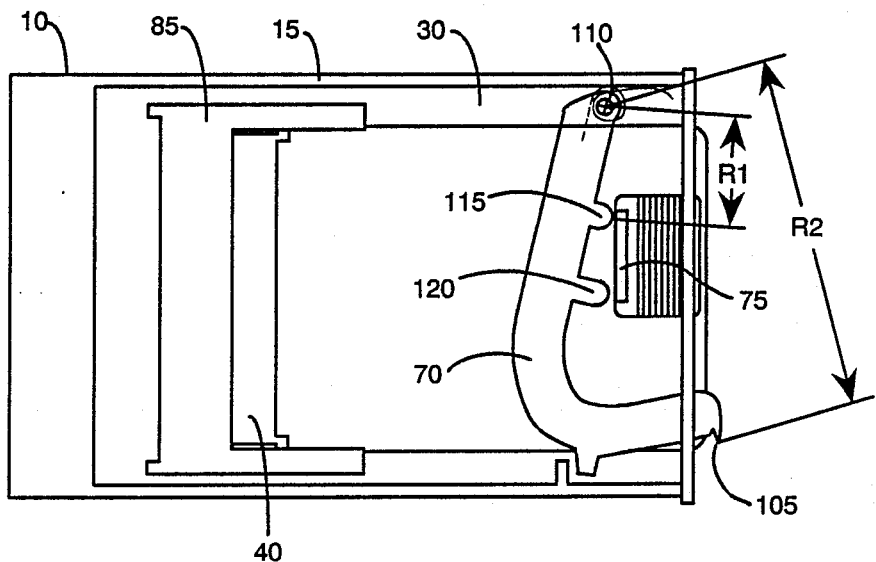
FIG. 8 is a section view of the housing showing the extractor arm extended so that a first abutment point contacts the electronic circuit module.

When arm 70 is in the position of FIG. 8 wherein protrusion 115 has just made contact with ridge 75 on lower surface 25D module 25, a further application of extraction force by the user on tip 105 is resisted by spring 125 and by the retentive friction force of connector 85 on module 25 as transmitted by ridge 75 to protrusion 115 of extractor arm 70. As seen in FIG. 8, protrusion 115 contacts ridge 75 at a radial distance R1 from pivot 110. The user's finger applies an extracting force on protrusion 105 at a radial distance of R2 from pivot 110. Thus, the force exerted by the user's finger is magnified by a first mechanical advantage equal to R2 divided by R1 and which is applied to ridge 75 via protrusion 115 on arm 70.

This first mechanical advantage allows the force applied to arm 70 by the user's finger to overcome the retentive frictional force exerted by connector 85 on module 25. The distance travelled by tip 105 under the force exerted by the user is divided by the mechanical advantage R2/R1 to yield the travel distance of module 25 away from connector 85. This short travel distance of module 25 is sufficient to overcome and escape the retentive frictional force exerted by connector 85 on module 25 and is sufficient to bring second protrusion 120 on extractor arm 70 into contact with ridge 75 on module 25 as seen in FIG. 9.

Figure 9:
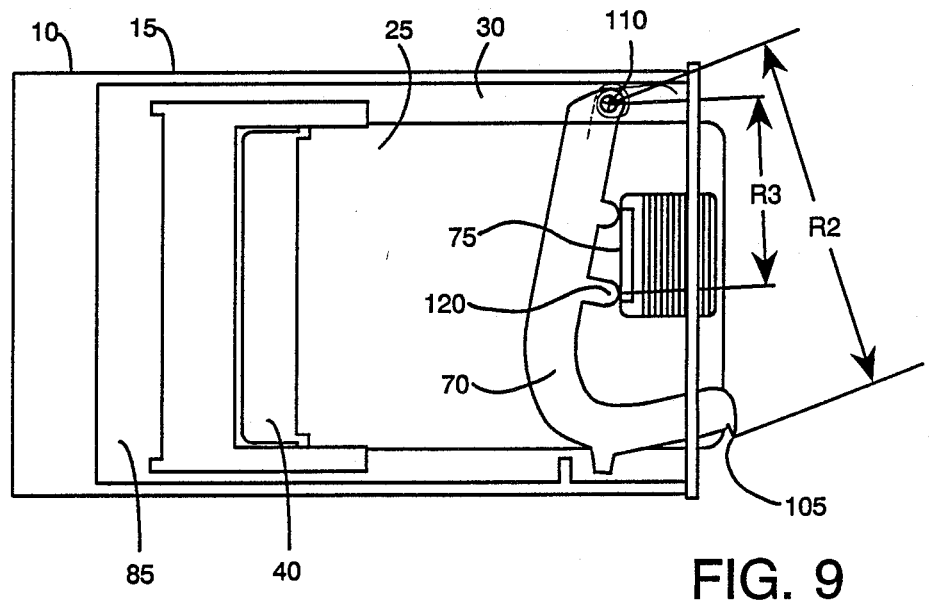
FIG. 9 is a section view of the housing showing the extractor arm extended so that a second abutment point contacts the electronic circuit module.

As depicted in FIG. 9, protrusion 120 is located on arm 70 at a radial distance R3 relative to pivot 110 wherein R3 is greater than R1. Radius R2 divided by radius R3 provides a second mechanical advantage (R2/R3) which is less than the first mechanical advantage (R2/R1). Correspondingly, the lesser second mechanical advantage provides a greater extraction travel distance for module 25 than provided by the first mechanical advantage. Since the static retentive frictional force of connector 85 on module 25 has already been overcome by the action of the first greater mechanical advantage described earlier, the first greater mechanical advantage is no longer required. Once this static retentive frictional force is overcome, a second lesser mechanical advantage is employed against the dynamic retentive frictional force to continue extraction of module 25 from module receiving apparatus 10. This second mechanical advantage results in correspondingly increased travel distance of module 25 away from connector 85 for a given travel distance of protrusion tip 105 on extractor arm 70. This second mechanic advantage is used for the remainder of the module 25 extraction. Extractor arm travel distance (protrusion 105 travel distance) relative to module 25 travel distance are thus seen to be optimized against the force applied by the user to extractor arm 70 relative to the magnified force transmitted to module 25.

Figure 10:
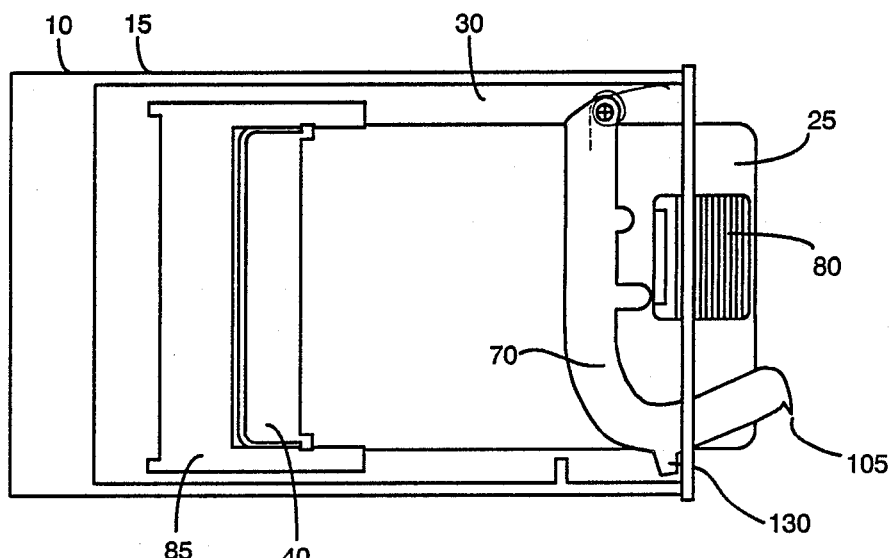
FIG. 10 is a section view of the housing showing the extractor arm fully extended so that the electronic circuit module can be grasped by the user's fingers for removal.

FIG. 10 shows extractor arm 70 in the fully extracted position. The travel of arm 70 is limited by the abutment of protrusion 130 against the inner front surface of housing 15 as shown in FIG. 10. In that position, module 25 is sufficiently extracted from module receiving apparatus 10 such that serrated portion 80 of module 25 can be easily grasped by the fingers of the user to complete the extraction of module 25 from apparatus 10.

In the preferred embodiment of the present invention, the first mechanical advantage presented by the ratio of R2 to R1 is approximately 3 to 1. The second lesser mechanical advantage presented by the ratio of R2 to R3 is approximately 16 to 9.

It can be seen by the above description that three regions are present in the extraction travel distance of protrusion 105 of arm 70. In the first region of travel, the extraction force provided by the user's finger to protrusion 105 is resisted only by the force of spring 125 acting against arm 70. In the second region of travel, a first mechanical advantage is applied against the static retentive frictional force which pairs of contacts 90A-90B of connector 85 exert on module 25. When that static retentive frictional force is overcome, a second lesser mechanical advantage is then applied to module 25 through ridge 75 thus taking advantage of a greater relative travel distance over the third region of travel of extractor arm protrusion tip 105. The forces which the user's finger must apply in extracting the module are thus substantially optimized during the extraction operation.

Although an apparatus for module extraction has been described having two protrusion points and providing two mechanical advantages, it will be appreciated by those skilled in the art that alternative embodiments of the invention wherein extractor arm 70 includes one protrusion as well as other embodiments wherein extractor arm 70 includes more than two protrusions may be desirable.

Figure 11:
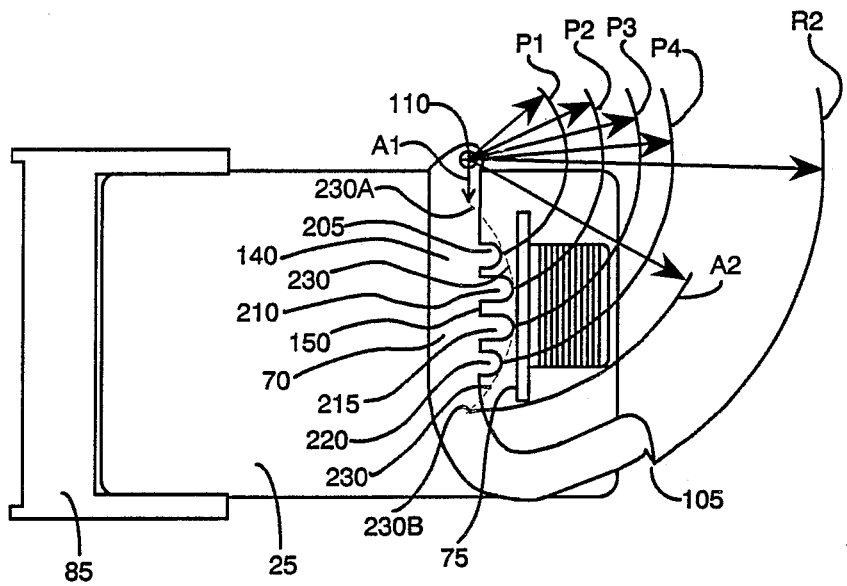
FIG. 11 is a section view of the housing showing an alternative extractor arm having four protrusions.

For example, an embodiment of the invention wherein the number of protrusions located along the inner contour 150 of arm portion 140 of extractor arm 70 is greater than two is shown in FIG. 11. More specifically, FIG. 11 shows module 25 partially extracted from connector 85 which is housed within housing 15 (not shown) of apparatus 10. Module 25 is shown at an intermediate stage of extraction from connector 85. Four protrusion points 205, 210, 215 and 220 are shown on inner contour 150 of arm portion 140 of extractor arm 70. Protrusion points 205, 210, 215 and 220 are shown in FIG. 11 as being tangent to an arc 230 and are located at radial distances relative to pivot 110 of P1, P2, P3 and P4 respectively. The first end 230A of arc 230 is located closer to pivot 110 than is the second end 230B of arc 230. The contour of arc 230 is shaped such that protrusion points tangent to arc 230 make contact with ridge 75 of module 25 sequentially starting near first end 230A of arc 230 and ending near second end 230B of arc 230. That is, the lever arm between pivot point 110 and protrusion tip 105 acting at radius R2 and the lever arm acting between pivot 110 and sequentially increasing radii P1, P2, P3 and P4 sequentially provide decreasing mechanical advantages of R2 divided by P1 (R2/P1), R2/P2, R2/P3 and R2/P4 respectively.

Alternative embodiments of the extractor apparatus of the invention are contemplated wherein extractor arm 70 includes a lesser number of protrusions or a greater number of protrusions than is shown in FIG. 11, each protrusion being substantially tangent to arc 230.

Such protrusions are provided between first end 230A and second end 230B of arc 230 along inner surface 150 of extractor arm portion 140 of extractor arm 70.

An embodiment of the invention having a single protrusion located along the inner contour 150 of arm portion 140 of extractor arm 70 and exhibiting a single mechanical advantage is also indicated in FIG. 11. More specifically, another embodiment of the invention is contemplated wherein a single continuous protrusion substantially tangent to arc 230 from first end 230A to second end 230B is employed to provide a continuously varying mechanical advantage as module 25 is extracted from opening 30 of housing 15 of apparatus 10. That is, a single protrusion may be provided in substantially the shape of arc 230 along inner surface 150 of extractor arm portion 140 of extractor arm 70. As module 25 is extracted, the point of tangency between the single protrusion, which is in substantially the shape of arc 230, and ridge 75 mounted on module 25 moves continuously in a direction from adjacent first end 230A to adjacent the second end 230B of arc 230. First end 230 of arc 230 is situated at radius distance A1 from pivot point 110, and second end 230B of arc 230 is situated at radius distance A2 from pivot point 110.

When a single continuous protrusion is provided substantially along the shape of arc 230 beginning substantially at first end 230A and ending substantially at second end 230B of arc 230, a corresponding continuously varying mechanical advantage is similarly provided. That continuous mechanical advantage varies from a maximum value of R2 divided by A1 (R2/A1) to a minimum value of R2 divided by A2 (R2/A2) and varies continuously from substantially that maximum value to substantially that minimum value as module 25 is extracted from opening 30 of housing 15 of apparatus 10.

While an apparatus for module extraction has been described above, it will be appreciated that a method for extracting a module which is removably inserted into a connector within a housing has also been disclosed. In that method, the module is insertable and removable through an opening in the housing. The method includes the steps of providing the housing with a lever arm situated substantially within the housing and including one end extending from the housing sufficiently far to enable a user to grasp the arm. The lever arm includes first and second engagement points for contacting the module within the housing. The method further includes the step of applying a first relatively high level extraction force to the module at the first engagement point to overcome the static retentive frictional force between the module and the connector via a relatively high first mechanical advantage exhibited by the arm end with respect to the first engagement point. The method continues with the step of applying a second extraction force less than the first extraction force to the module at the second engagement point to move the module sufficiently far through the opening to enable the user to grasp and remove the module, the arm end exhibiting a second mechanical advantage with respect to the second engagement point less than the first mechanical advantage.

The foregoing describes an apparatus and method for extracting a removable electronic module from a housing for the electronic module. The described apparatus and method provides for extracting the electronic module from a connector situated within the housing without resorting to a separate tool. Moreover, the described apparatus and method provides for extracting an electronic module from the connector without mounting a rotatable removal ring or a lever mechanism on the module to be removed.

While only certain preferred features of the invention have been shown by way of illustration, many modifications and changes will occur to those skilled in the art. It is, therefore, to be understood that the present claims are intended to cover all such modifications and changes which fall within the true spirit of the invention.

I claim:

1. An electronic module removal apparatus comprising:
   a housing including an opening for removably receiving an electronic module, said module including upper and lower opposed surfaces, an engagement point being situated on said lower surface, said housing including a chamber which communicates with said opening and which receives said module therein, said module being insertable in said chamber through said opening in a first direction and being removable from said chamber in a second direction opposite said first direction;
   holding means, situated within said housing, for removably holding said module in a fixed position within said chamber via frictional retentive force such that a predetermined amount of force is required to move said module in said second direction;
   an extractor arm including
      first and second portions, said first portion being pivotally mounted to a pivot point within said chamber, said second portion being situated within said chamber and extending sufficiently far outside said housing to permit grasping by a user;
      a first protrusion for contacting the engagement point of said module to move said module a first travel distance in said second direction so as to disengage said module from said holding means when the user pulls on said second portion and pivots said extractor arm, and
      a second protrusion for contacting the engagement point of said module subsequent to said first protrusion contacting said engagement point as the user continues to pull on the second portion and pivots said extractor arm further so as to move said module a second travel distance sufficiently large to expose a portion of said module outside said chamber to enable removal of said module by the user.

2. The apparatus of claim 1 wherein said holding means comprises an electrical connector.

3. The apparatus of claim 1 wherein said second travel distance is larger than said first travel distance.

4. The apparatus of claim 1 wherein the second portion of said extractor arm is angularly oriented with respect to the first portion of said extractor arm.

5. An electronic module removal apparatus comprising:
   a housing including an opening for removably receiving an electronic module, said module including upper and lower opposed surfaces and an edge, an engagement point being situated on said lower surface, said housing including a chamber which communicates with said opening and which receives said module therein, said module being insertable in said chamber through said opening in a first direction and being removable from said chamber in a second direction opposite said first direction;

an edge connector, situated within said housing, for removably holding via frictional retentive force said module in a fixed position within said chamber such that a predetermined amount of force is required to remove said module in said second direction, said edge connector providing electrical connection to said module;

an extractor arm including first and second portions, said first portion being pivotally mounted to a pivot point within said chamber, said second portion being situated within said chamber and extending sufficiently far outside said housing to permit grasping by a user;

a first protrusion for contacting the engagement point of said module, said first protrusion forming a first lever arm with respect to said pivot point, said first lever arm exhibiting a first mechanical advantage sufficiently large to move said module a first travel distance to remove the edge of said module from said edge connector when the user pulls on said second portion, and a second protrusion for contacting the engagement point of said module subsequent to said first protrusion contacting said engagement point as the user pulls on the second portion, said second protrusion forming a second lever arm with respect to said pivot point, said second lever arm exhibiting a second mechanical advantage smaller than said first mechanical advantage but sufficiently large to move said module a second travel distance into a position for the user to remove said module from said housing when the user continues to pull on said second portion, said second travel distance being larger than said first travel distance.

6. An electronic module removal apparatus comprising:

a housing including an opening for removably receiving an electronic module, said module including upper and lower opposed surfaces and an edge, an engagement point being situated on said lower surface, said housing including a chamber which communicates with said opening and which receives said module therein, said module being insertable in said chamber through said opening in a first direction and being removable from said chamber in a second direction opposite said first direction;

holding means, situated within said housing, for removably holding via static frictional retentive force said edge of said module in a fixed position within said chamber, such that a predetermined amount of force is required to overcome said static frictional retentive force and remove said module in said second direction;

an extractor arm including first and second portions, said first portion being pivotally mounted to a pivot point within said chamber, said second portion being situated within said chamber and extending sufficiently far outside said housing to permit grasping by a user;

a first protrusion which forms a first lever arm with respect to said pivot point, said first lever arm exhibiting a first mechanical advantage sufficient to overcome said static frictional retentive force of said holding means to permit removal of said module from said holding means when the user pulls on said second portion to move said module in said second direction, and a second protrusion which forms a second lever arm with respect to said pivot point, said second lever arm exhibiting a second mechanical advantage less than said first mechanical advantage but sufficiently large to overcome dynamic frictional retentive force exerted by said chamber on said module after said module is removed from said holding means, thus permitting said module to continue to move in said second direction and be exposed when the user continues to pull on said second portion after said module is removed from said holding means.

* * * * *